(12) United States Patent
Oh et al.

(10) Patent No.: US 8,742,413 B2
(45) Date of Patent: Jun. 3, 2014

(54) PHOTOSENSOR AND METHOD OF MANUFACTURING THE SAME

(75) Inventors: Jae-Hwan Oh, Osan-si (KR); Won-Kyu Lee, Seoul (KR); Seong-Hyun Jin, Suwon-si (KR); Young-Jin Chang, Yongin-si (KR); Jae-Beom Choi, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 34 days.

(21) Appl. No.: 13/239,627

(22) Filed: Sep. 22, 2011

(65) Prior Publication Data

US 2012/0168745 A1     Jul. 5, 2012

(30) Foreign Application Priority Data

Jan. 5, 2011   (KR) .................. 10-2011-0001074

(51) Int. Cl.
*H01L 31/0264*     (2006.01)
*H01L 31/20*       (2006.01)

(52) U.S. Cl.
USPC ............... 257/43; 257/87; 257/431; 257/458; 257/E31.032; 257/E31.037

(58) Field of Classification Search
USPC ................... 257/43, 431, 458, 461, E31.032, 257/E31.037
See application file for complete search history.

(56) References Cited

U.S. PATENT DOCUMENTS

| 7,645,646 | B2 * | 1/2010 | Young | 438/145 |
| 7,772,667 | B2 * | 8/2010 | Sugawara et al. | 257/458 |
| 2006/0258080 | A1 * | 11/2006 | Takahashi | 438/231 |
| 2008/0116454 | A1 * | 5/2008 | Shimizu | 257/43 |
| 2008/0185691 | A1 * | 8/2008 | Cheng et al. | 257/656 |
| 2010/0134735 | A1 * | 6/2010 | Nakamura et al. | 349/116 |
| 2010/0171128 | A1 * | 7/2010 | Brown et al. | 257/84 |
| 2010/0201664 | A1 * | 8/2010 | Lee et al. | 345/207 |
| 2010/0276773 | A1 * | 11/2010 | Sasagawa et al. | 257/432 |
| 2011/0148835 | A1 * | 6/2011 | Yamazaki | 345/207 |
| 2011/0176652 | A1 * | 7/2011 | Kurokawa | 377/49 |
| 2011/0180894 | A1 * | 7/2011 | Samuelson et al. | 257/438 |
| 2011/0316427 | A1 * | 12/2011 | Okajima | 315/151 |
| 2012/0200546 | A1 * | 8/2012 | Miyamoto et al. | 345/205 |
| 2012/0261645 | A1 * | 10/2012 | Cho et al. | 257/29 |

FOREIGN PATENT DOCUMENTS

| KR | 10-0625057 | | 9/2006 | | |
| KR | 10-2010-0061393 | | 6/2010 | | |
| KR | 10-2010-0083322 | | 7/2010 | | |
| WO | WO /2010/100824 | * | 9/2010 | ............ | G02F 1/1368 |
| WO | WO /2011/045956 | * | 4/2011 | ............ | H01L 27/146 |

\* cited by examiner

*Primary Examiner* — Lex Malsawma
*Assistant Examiner* — Sheng Zhu
(74) *Attorney, Agent, or Firm* — Robert E. Bushnell, Esq.

(57) ABSTRACT

In a photosensor and a method of manufacturing the same, the photosensor comprises: an intrinsic silicon layer formed on a substrate; a P-type doped region formed in a same plane with the intrinsic silicon layer; and an oxide semiconductor layer formed on or under the intrinsic silicon layer, and overlapping an entire region of the intrinsic silicon layer.

18 Claims, 7 Drawing Sheets

PHOTOSENSOR AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Jan. 5, 2011 and there duly assigned Serial No. 10-2011-0001074.

BACKGROUND OF THE INVENTION

1. Field of the Invention

The present invention relates to a photosensor and a method of manufacturing the same.

2. Description of the Related Art

A photosensor having a P-I-N structure is a semiconductor device which converts an optical signal into an electrical signal. In a photosensor having the P-I-N structure, a negative voltage may be applied to a P-type doped region, and a positive voltage may be applied to an N-type doped region. In this state, if light is incident on the photosensor, the energy of the incident light causes electrons and holes to be generated in an intrinsic region or causes electrons and holes to be generated in an N/P-type doped region, and then to diffuse to the intrinsic region. Consequently, electric current flows through the photosensor due to a reverse electric field of the intrinsic region. In this regard, a larger amount of light or higher energy causes more current to flow through the photosensor, and transistors output electrical signals according to the amount of current, thereby operating the photosensor.

To form the P-I-N structure, two rounds of doping process (that is, P-type doping and N-type doping) are required, which complicates the manufacturing process and raises manufacturing costs.

SUMMARY OF THE INVENTION

The present invention provides a photosensor including an oxide semiconductor, the photosensor being manufactured without an additional mask process.

The present invention also provides a method of manufacturing a photosensor, which includes an oxide semiconductor, without an additional mask process.

However, the present invention is not restricted to the disclosure set forth herein. The aspects of the present invention will become more apparent to one of ordinary skill in the art to which the present invention pertains by referencing the detailed description of the present invention given below.

According to an aspect of the present invention, a photosensor comprises: an intrinsic silicon layer formed on a substrate; a P-type doped region formed in a same plane with the intrinsic silicon layer; and an oxide semiconductor layer formed on or under the intrinsic silicon layer, and overlapping an entire region of the intrinsic silicon layer.

According to another aspect of the present invention, a photosensor comprises: an intrinsic silicon layer formed on a substrate; a P-type doped region formed in a same plane with the intrinsic silicon layer; an oxide semiconductor layer formed on or under the intrinsic silicon layer and directly contacting an entire region of the intrinsic silicon layer; an insulating film formed on an entire surface of the substrate having the intrinsic silicon layer, the P-type doped region, and the oxide semiconductor layer; a first contact hole formed in the insulating film and exposing the P-type doped region; a second contact hole formed in the insulating film and exposing a predetermined region of the oxide semiconductor layer; a first electrode formed in the first contact hole and on the insulating film so as to be in contact with the P-type doped region; and a second electrode formed in the second contact hole and on the insulating film so as to be in contact with the oxide semiconductor layer.

According to another aspect of the present invention, a method of manufacturing a photosensor comprises: forming an intrinsic silicon layer on a substrate; forming a P-type doped region in a region of the intrinsic silicon layer; and forming an oxide semiconductor layer, which overlaps an entire region of the intrinsic silicon layer, on or under the intrinsic silicon layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of elements may be exaggerated for clarity. Like reference numerals refer to like elements throughout the specification. As used herein, the term "and/or" includes any and all combinations of one or more of the associated listed items.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "made of," when used in this specification, specify the presence of stated components, steps, operations, and/or elements, but do not preclude the presence or addition of one or more other components, steps, operations, elements, and/or groups thereof It will be understood that, although the terms first, second, third, etc. may be used herein to describe various elements, these elements should not be limited by these terms. These terms are only used to distinguish one element from another element. Thus, a first element discussed below could be termed a second element without departing from the teachings of the present invention Embodiments of the invention are described herein with reference to planar and cross-section illustrations which are schematic illustrations of idealized embodiments of the invention. As such, variations from the shapes of the illustrations as a result, for example, of manufacturing techniques and/or tolerances are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device, and are not intended to limit the scope of the invention.

Unless otherwise defined, all terms (including technical and scientific terms) used herein have the same meaning as commonly understood by one of ordinary skill in the art to which this invention pertains. It will be further understood that terms, such as those defined in commonly used dictionaries, should be interpreted as having a meaning which is consistent with their meaning in the context of the relevant art and should not be interpreted in an idealized or overly formal sense unless expressly so defined herein.

A photosensor according to a first exemplary embodiment of the present invention will now be described with reference to FIG. 1.

Figure 1:
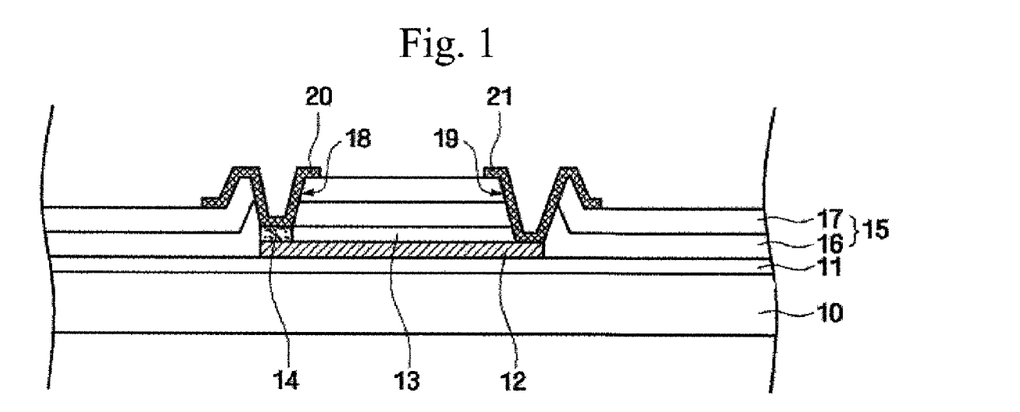
FIG. 1 is a schematic cross-sectional view of a photosensor according to a first exemplary embodiment of the present invention.

FIG. 1 is a schematic cross-sectional view of a photosensor according to a first exemplary embodiment of the present invention.

Referring to FIG. 1, the photosensor according to the first exemplary embodiment includes an oxide semiconductor layer 12, an intrinsic silicon layer 13, a P-type doped region 14, a first electrode 20, and a second electrode 21 formed on a substrate 10.

The substrate 10 may be an insulating substrate made of a glass material which contains $SiO_2$ as a main component, a plastic substrate, a quartz substrate, or the like. A buffer layer 11 may be formed on the substrate 10 to planarize the substrate 10 and to prevent penetration of impurity elements into the substrate 10. The buffer layer 11 may be made of $SiO_2$, $SiN_x$, or $SiO_xN_y$. The buffer layer 11 is optional.

The oxide semiconductor layer 12 is formed on the buffer layer 11. The oxide semiconductor layer 12 may include Hf oxide, Zn oxide, In oxide, Ga oxide, Sn oxide, Ti oxide, InZn oxide, InSn oxide, HfInZn oxide, GaInZn oxide, or a combination of the same. The oxide semiconductor layer 12 functions like an N-type semiconductor in a conventional P-I-N diode. In the HfInZn oxide, i.e., HfInZnOx (where $0<x≤2.5$), $Zn^{2+}$, which may exist outside a lattice or fail to combine with O due to Zn interstitials and O vacancies which occur naturally, acts as an acceptor. Therefore, the HfInZn oxide serves as an N-type semiconductor. Similarly, the Hf oxide, the Zn oxide, the In oxide, the Ga oxide, the Sn oxide, the Ti oxide, the InZn oxide, the InSn oxide, the HfInZn oxide, and the GaInZn oxide may serve as N-type semiconductors due to O vacancies. For example, the oxide semiconductor layer 12 may be HfInZn oxide or GaInZn oxide.

The oxide semiconductor layer 12 may have a thickness of 0.03 to 1 μm. When the thickness of the oxide semiconductor layer 12 is within the above range, an appropriate amount of current may flow. For example, the thickness of the oxide semiconductor layer 12 may be 0.05 μm.

The intrinsic silicon layer 13 and the P-type doped region 14 are formed on the oxide semiconductor layer 12. The intrinsic silicon layer 13 and the P-type doped region 14 are situated in the same plane to form a horizontal structure. On the other hand, the intrinsic silicon layer 13 and the P-type doped region 14 form a vertical structure with the oxide semiconductor layer 12 disposed thereunder. The intrinsic silicon layer 13 and the P-type doped region 14 are stacked on the oxide semiconductor layer 12. When the intrinsic silicon layer 13 is bonded to the P-type doped region 14 having a high work function and the oxide semiconductor layer 12 having a relatively low work function, a sufficiently thick depletion region is formed at a junction thereof, thus causing rectification.

The intrinsic silicon layer 13 may be made of polycrystalline silicon or amorphous silicon. The intrinsic silicon layer 13 may have a thickness of 0.03 to 1 μm. When the thickness of the intrinsic silicon layer 13 is within the above range, the resistance value thereof may not become too high or low but can be maintained within an appropriate range. For example, the thickness of the intrinsic silicon layer 13 may be 0.05 μm.

The P-type doped region 14 may be formed by implanting group 3 impurity ions into a region of the intrinsic silicon layer 13 disposed on the substrate 10. For example, boron (B), BF2 or B2H5 ions, which are group 3 impurity ions, may be implanted into a region of the intrinsic silicon layer 13 to form the P-type doped region 14. The P-type doped region 14 may also be an epitaxial layer, a chemical vapor deposition (CVD) layer, or a diffusion layer. The P-type doped region 14 has a higher work function than that of the oxide semiconductor layer 12 and has low resistivity.

The P-type doped region 14 may have a thickness of 0.03 to 1 μm. When the thickness of the P-type doped region 14 is within the above range, an appropriate amount of current may flow. For example, the thickness of the P-type doped region 14 may be 0.05 μm. The concentration of ions in the P-type doped region 14 may be $1.0^{10}$ to $1.0^{16}$ atom/cm$^2$. If the ion concentration of the P-type doped region 14 is $1.0^{10}$ atom/cm$^2$ or greater, an appropriate amount of photocurrent starts to flow when light is received. If the ion concentration of the P-type doped region 14 is $1.0^{16}$ atom/cm$^2$ or less, photocurrent generated from the received light does not recombine nor is it hindered. Therefore, an excessive increase in photocurrent can be prevented. For example, the ion concentration of the P-type doped region 14 may be approximately $1.0^{12}$ atom/cm$^2$.

In the photosensor according to the first exemplary embodiment, a sidewall of the oxide semiconductor layer 12 may be aligned with a sidewall of the P-type doped region 14. That is, the oxide semiconductor layer 12 and the intrinsic silicon layer 13 having the P-type doped region 14 may be patterned using the same mask. Therefore, no additional mask is required to pattern the oxide semiconductor layer 12. In addition, the light efficiency gain from the intrinsic silicon layer 13 and the light efficiency gain from the oxide semiconductor layer 12 combine to increase the light efficiency of the photosensor.

The entire region of the P-type doped region 14 and the intrinsic silicon layer 13 overlaps and directly contacts the oxide semiconductor layer 12. Since the oxide semiconductor layer 12 and the intrinsic silicon layer 13 are in contact with each other but not through a contact hole, an additional mask for forming the contact hole is not required.

An insulating film 15 is formed on the substrate 10 having the P-type doped region 14 and the intrinsic silicon layer 13.

The insulating film 15 may be formed on the entire surface of the substrate 10. The insulating film 15 may include a first insulating film 16 and a second insulating film 17. The first insulating film 16 and the second insulating film 17 may be made of $SiN_x$, $SiO_2$, or $SiO_xN_y$. If the photosensor according to the first exemplary embodiment of the present invention is formed on a substrate on which a thin-film transistor (TFT) is formed, the first insulating film 16 may be the same as a gate insulating film which insulates a semiconductor layer and a gate electrode of the TFT from each other, and the second insulating film 17 may be the same as an interlayer insulating film which insulates the gate electrode of the TFT from source and drain electrodes of the TFT.

The first electrode 20 in contact with the P-type doped region 14 and the second electrode 21 in contact with the oxide semiconductor layer 12 may be formed on the insulating film 15. The first electrode 20 is in contact with the P-type doped region 14 through a first contact hole 18 formed in the insulating film 15, and the second electrode 21 is in contact with the oxide semiconductor layer 12 through a second contact hole 19 formed in the insulating film 15.

The first electrode 20 and the second electrode 21 may be made of one or more materials selected from Mo, W, MoW, Ag, Mg, Al, Pt, Pd, Au, Ni, Nd, Ir, Cr, Li, and Ca. Otherwise, the first electrode 20 and the second electrode 21 may be made of one or more materials selected from ITO, IZO, ZnO, and $In_2O_3$.

A photosensor according to a second exemplary embodiment of the present invention will now be described with reference to FIG. 2.

Figure 2:
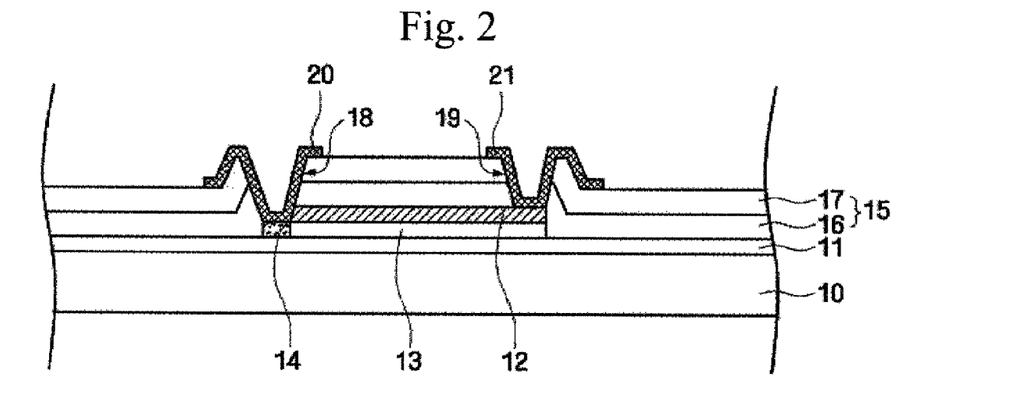
FIG. 2 is a schematic cross-sectional view of a photosensor according to a second exemplary embodiment of the present invention.

FIG. 2 is a schematic cross-sectional view of a photosensor according to a second exemplary embodiment of the present invention. Elements substantially identical to those illustrated in FIG. 1 are indicated by like reference numerals, and thus a detailed description thereof will be omitted.

Referring to FIG. 2, the photosensor according to the second exemplary embodiment is different from the photosensor according to the first exemplary embodiment in that an intrinsic silicon layer 13 and a P-type doped region 14 are formed on a buffer layer 11, and an oxide semiconductor layer 12 is formed on the intrinsic silicon layer 13. The oxide semiconductor layer 12 is stacked on the intrinsic silicon layer 13 and the P-type doped region 14.

In the photosensor according to the second exemplary embodiment, a sidewall of the oxide semiconductor layer 12 may be aligned with a sidewall of the intrinsic silicon layer 13. That is, the oxide semiconductor layer 12 and the intrinsic silicon layer 13 may be patterned using the same mask. Therefore, no additional mask is required to pattern the oxide semiconductor layer 12. In addition, the light efficiency gain from the intrinsic silicon layer 13 and the light efficiency gain from the oxide semiconductor layer 12 combine to increase the light efficiency of the photosensor.

The entire region of the oxide semiconductor layer 12 overlaps and directly contacts the intrinsic semiconductor layer 13. Alternatively, the entire region of the oxide semiconductor layer 12 may overlap and directly contact the entire region of the intrinsic semiconductor layer 13 and a portion of the P-type doped region 14. Since the oxide semiconductor layer 12 and the intrinsic silicon layer 13 are in contact with each other but not through a contact hole, an additional mask for forming the contact hole is not required.

A flat panel display (FPD) including the photosensor according to the first exemplary embodiment of the present invention will now be described with reference to FIG. 3.

Figure 3:
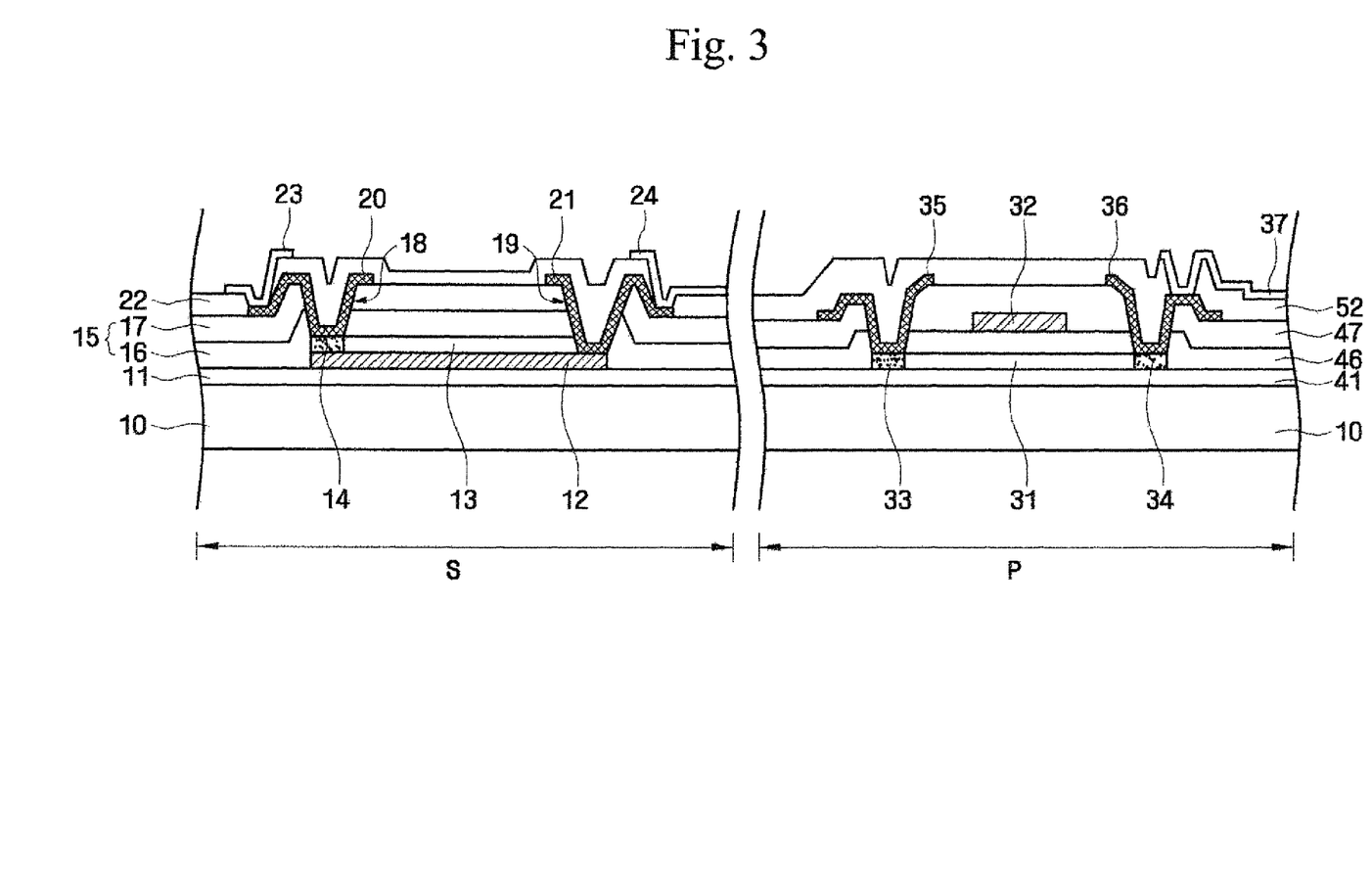
FIG. 3 is a schematic cross-sectional view of a flat panel display (FPD) including the photosensor according to the first exemplary embodiment of the present invention.

FIG. 3 is a schematic cross-sectional view of an FPD including the photosensor according to the first exemplary embodiment of the present invention.

Referring to FIG. 3, the FPD may include a sensor region S in which a photosensor is formed and a pixel region P in which a display element and a TFT for driving the display element are formed. In the sensor region S, the photosensor shown in FIG. 1 or 2 may be formed. Although the photosensor of FIG. 1 is illustrated in FIG. 3, the photosensor of FIG. 2 can also be applied.

The pixel region P includes one or more pixel region TFTs. In FIG. 3, one pixel region TFT connected directly to a pixel electrode 37 is illustrated for simplicity. However, the present invention is not limited thereto. In addition to the pixel region TFT, various elements such as a switching element and a capacitor may further be included in the pixel region P, as desired.

A buffer layer 41 of the pixel region P may be the same as the buffer layer 11 of the sensor region S. A semiconductor layer 31 of the pixel region P is formed on the buffer layer 41 of the pixel region P, and the semiconductor layer 31 may be formed of the same silicon layer as the intrinsic silicon layer 13 of the sensor region S may be formed, using the same silicon layer. Like the P-type doped region 14 of the sensor region S, source and drain regions 33 and 34, respectively, of the semiconductor layer 31 in the pixel region P may be regions doped with P-type impurities.

A gate insulating film 46 is formed on the semiconductor layer 31 of the pixel region P. The gate insulating film 46 may be the same as the first insulating film 16 of the sensor region S. A gate electrode 32 is formed on the gate insulating film 46 of the pixel region P. An interlayer insulating film 47 is formed on the gate electrode 32 of the pixel region P. The interlayer insulating film 47 may be the same as the second insulating film 17 of the sensor region S.

Source and drain electrodes 35 and 36, respectively, electrically connected to the source and drain regions 33 and 34, respectively, of the semiconductor layer 31 are formed on the interlayer insulating film 47 of the pixel region P. The source and drain electrodes 35 and 36, respectively, of the pixel region P may be made of the same material as the first and second electrodes 20 and 21, respectively, of the sensor region S. That is, a conductive film may be formed on the second insulating film 17 of the sensor region S and the interlayer insulating film 47 of the pixel region P, and then patterned to form the source and drain electrodes 35 and 36, respectively, of the pixel region P and the first and second electrodes 20 and 21, respectively, of the sensor region S.

A third insulating film 22 may be formed on the first and second electrodes 20 and 21, respectively, of the sensor region S, and a passivation film 52 may be formed on the source and drain electrodes 35 and 36, respectively, of the pixel region P. The third insulating film 22 may be the same as the passivation film 52.

The pixel electrode 37 electrically connected to the source or drain electrode 35 or 36, respectively, may be formed on the passivation film 52 of the pixel region P. When the pixel electrode 37 is formed, a third electrode 23 electrically connected to the first electrode 20 and a fourth electrode 24 electrically connected to the second electrode 21 may also be formed in the sensor region S by using the same layer used to form the pixel electrode 37.

Although which display elements are disposed on the pixel electrode 37 is not illustrated in FIG. 3, various display elements may be situated in the pixel region P. For example, a common electrode (not shown) may be formed on the pixel electrode 37, and an organic light-emitting diode (OLED)

having an organic light-emitting layer (not shown) may be formed between the pixel electrode 37 and the common electrode.

When any one of photosensors according to exemplary embodiments of the present invention is applied in a flat panel display (FPD) having a TFT, insulating films for the TFT can be used, and no additional insulating film need be formed. Furthermore, since an oxide semiconductor layer and an intrinsic silicon layer are patterned using the same mask, no additional mask is needed or used.

A method of manufacturing the photosensor according to the first exemplary embodiment of the present invention will now be described with reference to FIGS. 1 and 4 thru 7.

FIGS. 4 thru 7 are cross-sectional views illustrating a method of manufacturing the photosensor according to the first exemplary embodiment of the present invention. Elements substantially identical to those illustrated in FIG. 1 are indicated by like reference numerals, and thus a detailed description thereof will be omitted.

Figure 4:
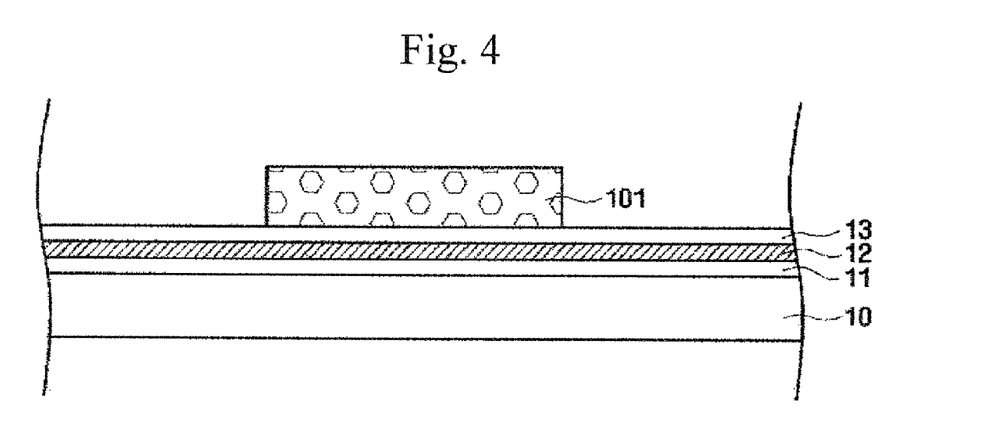
FIGS. 4 thru 7 are cross-sectional views illustrating a method of manufacturing the photosensor according to the first exemplary embodiment of the present invention.

Referring to FIG. 4, a buffer layer 11, an oxide semiconductor layer 12, and an intrinsic silicon layer 13 are sequentially formed on a substrate 10. The substrate 10 may be an insulating substrate made of a glass material which contains $SiO_2$ as a main component, a plastic substrate, a quartz substrate, or the like. The buffer layer 11 may be formed using any one of $SiO_2$, $SiN_x$, and $SiO_x N_y$. The buffer layer 11 is optional.

The oxide semiconductor layer 12 may be made of Hf oxide, Zn oxide, In oxide, Ga oxide, Sn oxide, Ti oxide, InZn oxide, InSn oxide, HfInZn oxide, GaInZn oxide, or a combination of the same. The oxide semiconductor layer 12 may be formed by RF magnetron sputtering at a low temperature and may be formed to a thickness of 0.03 to 1 μm. When the thickness of the oxide semiconductor layer 12 is within the above range, an appropriate amount of current may flow. For example, the thickness of the oxide semiconductor layer 12 may be 0.05 μm. The above-suggested materials, method, and processing conditions used to form the oxide semiconductor layer 12 are mere examples, and the present invention is not limited thereto. The oxide semiconductor layer 12 can be formed using various materials, methods, and processing conditions.

The intrinsic silicon layer 13 may be formed as a polycrystalline silicon layer or an amorphous silicon layer. When the intrinsic silicon layer 13 is formed as an amorphous silicon layer, it may be formed by chemical vapor deposition (CVD) using, for example, an $SiH_4$ gas. When the intrinsic silicon layer 13 is formed as a polycrystalline silicon layer, an amorphous silicon layer may be deposited and then crystallized into a polycrystalline layer using a conventional crystallization method, such as solid phase crystallization (SPC), laser crystallization, or crystallization method using metal.

A first photoresist pattern 101 is formed on the intrinsic silicon layer 13.

Figure 5:
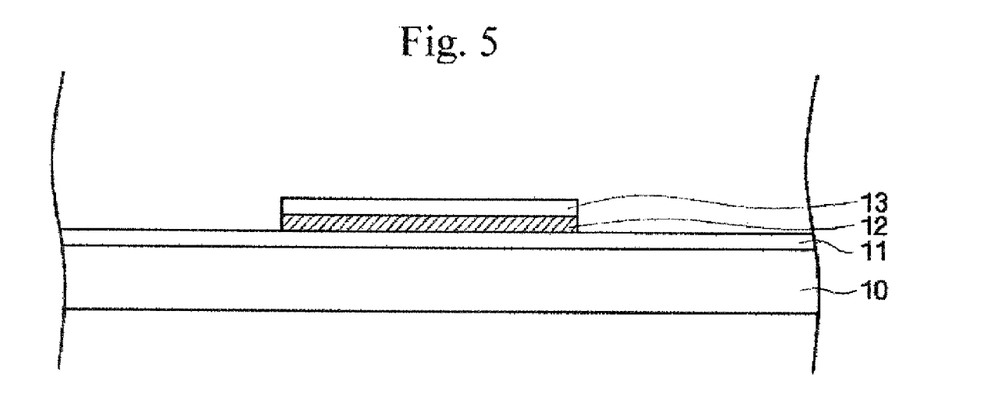

Referring to FIG. 5, the intrinsic silicon layer 13 and the oxide semiconductor layer 12 are etched using the first photoresist pattern 101 as an etch mask. The intrinsic silicon layer 13 and the oxide semiconductor layer 12 may be wet-etched or dry-etched using a known etchant or etching gas. The intrinsic silicon layer 13 and the oxide semiconductor layer 12 may be etched separately.

Figure 6:
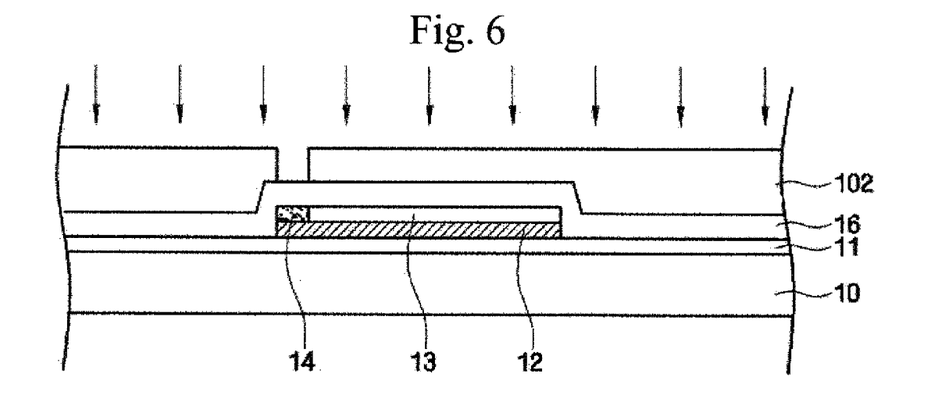

Referring to FIG. 6, the first photoresist pattern 101 is removed, and then a first insulating film 16 is formed on the entire surface of the substrate 10 having the etched intrinsic silicon layer 13 and the etched oxide semiconductor layer 12. The first insulating film 16 may be formed of $SiN_x$, $SiO_2$, or $SiO_x N_y$ by, e.g., CVD.

A blocking film 102 is formed on the first insulating film 16 to expose a region of the first insulating film 16 which corresponds to a region of the intrinsic silicon layer 13 in which a P-type doped region 14 is to be formed. The blocking film 102 may be made of a photoresist material. However, the present invention is not limited thereto. For example, the blocking film 102 may also be made of $SiO_2$ or $Si_3N_4$.

Next, group 3 impurity ions are implanted into the region of the intrinsic silicon layer 13 which corresponds to the region of the first insulating film 16 exposed by the blocking film 102, thereby forming the P-type doped region 14. A material used for the implantation of group 3 impurity ions may be any one of B, $BF_2$, and $B_2H_5$. The P-type doped region 14 may be formed to a thickness of 0.03 to 1 μm, and the ions may be implanted to a dose of $1.0^{10}$ to $1.0^{16}$ atom/cm$^2$ at an energy of 5 to 50 KeV. The material, method, and processing conditions used for P-type doping are not limited to the above examples and can vary.

Figure 7:
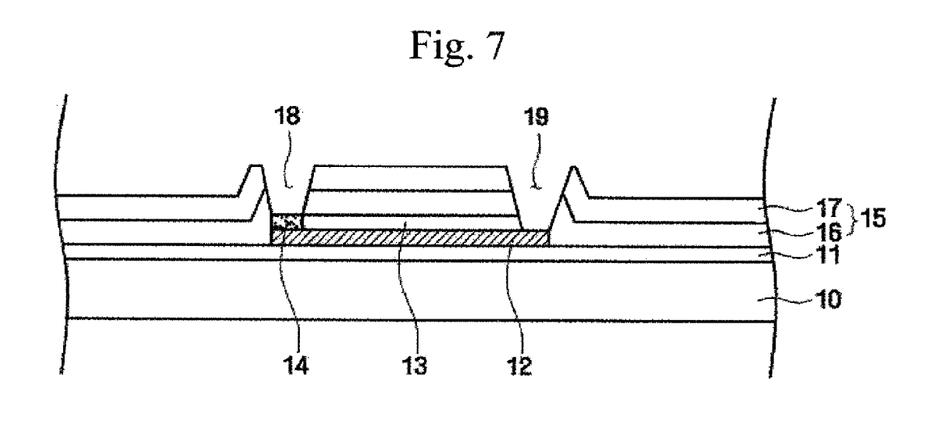

Referring to FIG. 7, the blocking film 102 is removed, and then a second insulating film 17 is formed on the first insulating film 16. Next, predetermined regions of each of the first and second insulating films 16 and 17, respectively, are removed to form a first contact hole 18 which exposes the P-type doped region 14 and a second contact hole 19 which exposes a predetermined region of the oxide semiconductor layer 12.

Referring to FIG. 1, a conductive film is formed on the entire surface of the substrate 10 having the first and second contact holes 18 and 19, respectively, and then patterned to form a first electrode 20 and a second electrode 21. The conductive film may be formed of one or more materials selected from Mo, W, MoW, Ag, Mg, Al, Pt, Pd, Au, Ni, Nd, Ir, Cr, Li and Ca or one or more materials selected from ITO, IZO, ZnO and $In_2O_3$ by CVD or sputtering.

A method of manufacturing the photosensor according to the second exemplary embodiment of the present invention will now be described with reference to FIGS. 2 and 8 thru 11.

FIGS. 8 thru 13 are cross-sectional views illustrating a method of manufacturing the photosensor according to the second exemplary embodiment of the present invention. Elements substantially identical to those illustrated in FIGS. 1 thru 7 are indicated by like reference numerals, and thus a detailed description thereof will be omitted.

Figure 8:
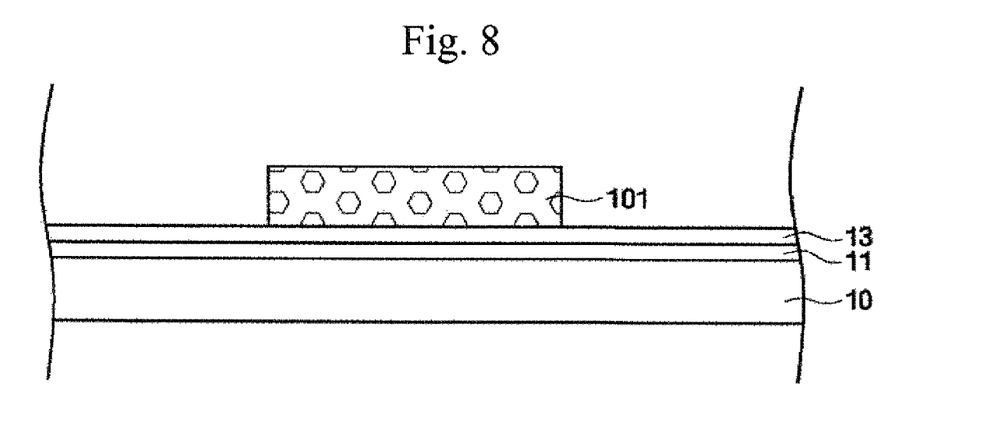
FIGS. 8 thru 13 are cross-sectional views illustrating a method of manufacturing the photosensor according to the second exemplary embodiment of the present invention.

Referring to FIG. 8, a buffer layer 11 and an intrinsic silicon layer 13 are sequentially formed on a substrate 10. A first photoresist pattern 101 is formed on the intrinsic silicon layer 13.

Figure 9:
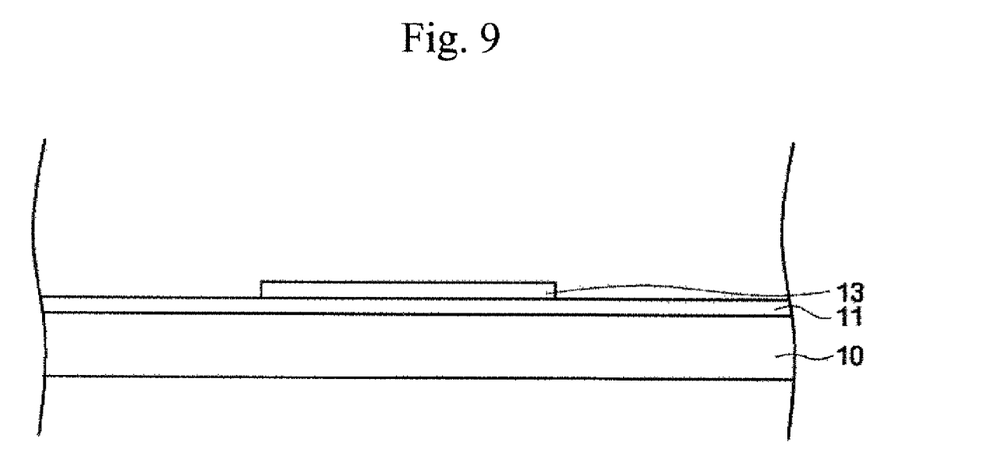

Referring to FIG. 9, the intrinsic silicon layer 13 is etched using the first photoresist pattern 101 as an etch mask. Then, the first photoresist pattern 101 is removed.

Figure 10:
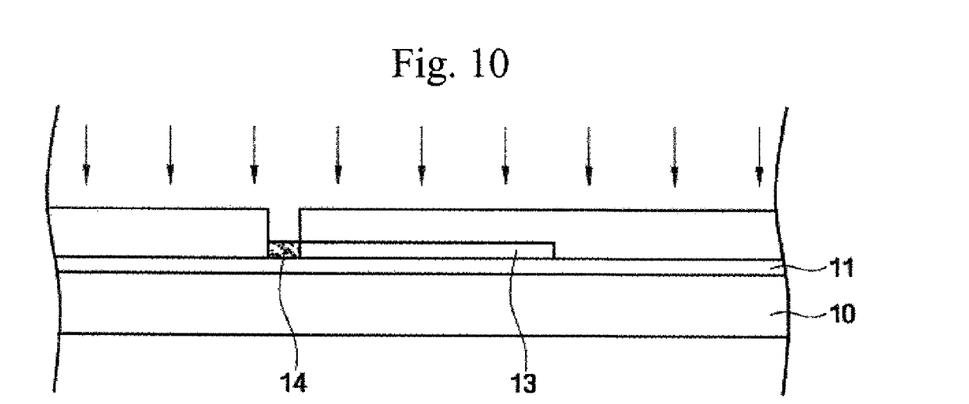

Referring to FIG. 10, after the removal of the first photoresist pattern 101, a blocking film 102 is formed on the etched intrinsic silicon layer 13 to expose a region of the intrinsic silicon layer 13 in which a P-type doped region 14 is to be formed. Group 3 impurity ions are implanted into the region of the intrinsic silicon layer 13 exposed by the blocking film 102, thereby forming the P-type doped region 14.

Figure 11:
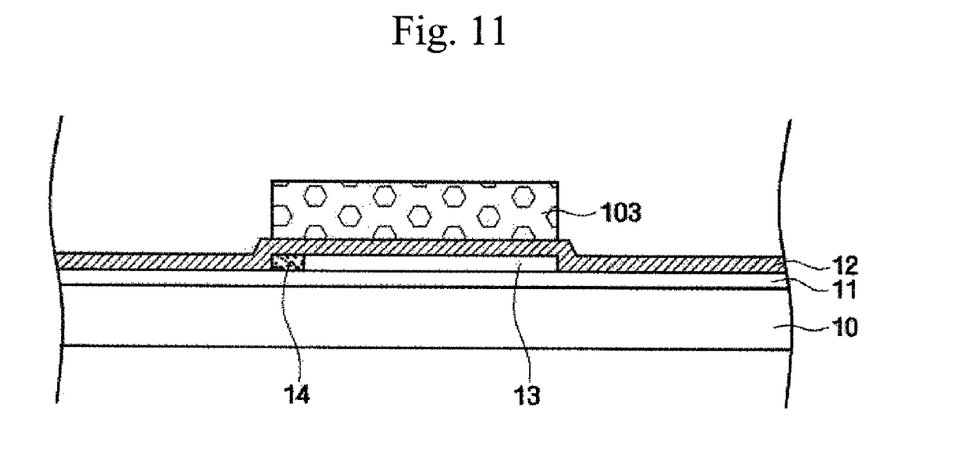

Referring to FIG. 11, the blocking film 102 is removed, and then an oxide semiconductor layer 12 is formed on the entire surface of the substrate 10 having the etched intrinsic silicon layer 13 and the P-type doped region 14. Next, a second photoresist pattern 103 is formed on the oxide semiconductor layer 12. The second photoresist pattern 103 may be formed using a mask used to form the first photoresist pattern 101.

Figure 12:
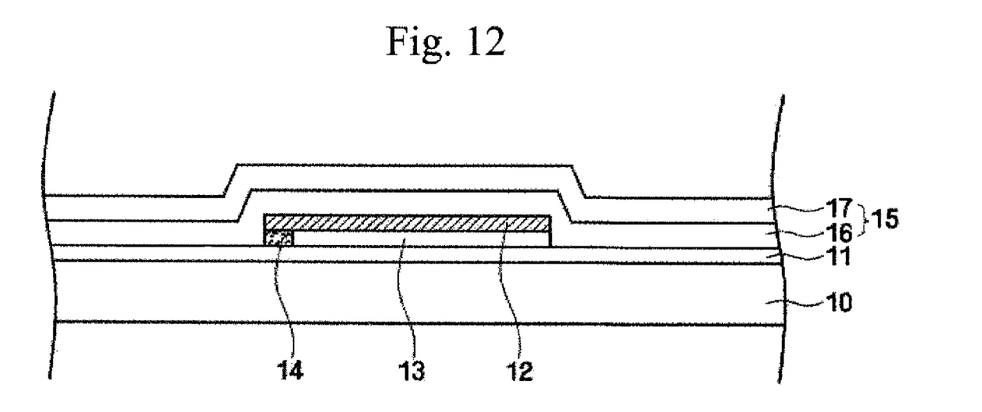

Referring to FIG. 12, the oxide semiconductor layer 12 is etched using the second photoresist pattern 103 as an etch mask. Then, the second photoresist pattern 103 is removed, and a first insulating film 16 and a second insulating film 17 are sequentially formed on the entire surface of the substrate 10 having the etched oxide semiconductor layer 12.

Figure 13:
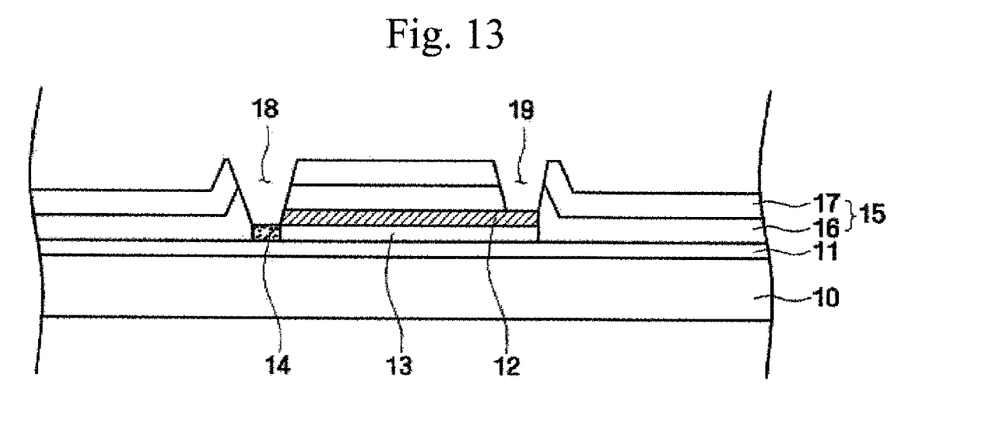

Referring to FIG. 13, predetermined regions of each of the first and second insulating films 16 and 17, respectively, are removed to form a first contact hole 18 which exposes the P-type doped region 14 and a second contact hole 19 which exposes a predetermined region of the oxide semiconductor layer 12.

Referring to FIG. 2, a conductive film is formed on the entire surface of the substrate 10 having the first and second contact holes 18 and 19, respectively, and is then patterned to form a first electrode 20 and a second electrode 21.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A photosensor, comprising:
   an intrinsic silicon layer formed on a substrate;
   a P-type doped region formed in a same plane as the intrinsic silicon layer; and
   an oxide semiconductor layer formed adjacent to the intrinsic silicon layer and overlapping an entire region of the intrinsic silicon layer, the oxide semiconductor functioning as an N-type semiconductor;
   wherein the intrinsic silicon layer and the P-type doped region form a horizontal structure, and the oxide semiconductor layer and the intrinsic silicon layer form a vertical structure, the P-type doped region and intrinsic silicon layer directly contact the oxide semiconductor.

2. The photosensor of claim 1, wherein the oxide semiconductor layer is in direct contact with the entire region of the intrinsic silicon layer.

3. The photosensor of claim 1, wherein the oxide semiconductor layer is formed under the intrinsic silicon layer, and a sidewall of the P-type doped region is aligned with a sidewall of the oxide semiconductor layer.

4. The photosensor of claim 1, wherein the oxide semiconductor layer is formed on top of the intrinsic silicon layer, and a sidewall of the intrinsic silicon layer is aligned with a sidewall of the oxide semiconductor layer.

5. The photosensor of claim 1, wherein the intrinsic silicon layer is one of a polycrystalline silicon layer and an amorphous silicon layer.

6. The photosensor of claim 1, wherein the oxide semiconductor layer comprises one of Hf oxide, Zn oxide, In oxide, Ga oxide, Sn oxide, Ti oxide, InZn oxide, InSn oxide, HfInZn oxide, GaInZn oxide, and a combination of the same.

7. The photosensor of claim 1, further comprising an insulating film formed on an entire surface of the substrate having the intrinsic silicon layer, the P-type doped region, and the oxide semiconductor layer.

8. The photosensor of claim 7, wherein the insulating film comprises a first insulating film and a second insulating film formed directly on the first insulating film.

9. The photosensor of claim 7, further comprising a first contact hole formed in the insulating film and exposing the P-type doped region and a second contact hole formed in the insulating film and exposing a predetermined region of the oxide semiconductor layer.

10. The photosensor of claim 9, further comprising a first electrode formed in the first contact hole and on the insulating film so as to be in contact with the P-type doped region and a second electrode formed in the second contact hole and on the insulating film so as to be in contact with the oxide semiconductor layer.

11. The photosensor of claim 1, further comprising a buffer layer formed between the substrate and one of the intrinsic silicon layer and the oxide semiconductor layer.

12. A photosensor, comprising:
    an intrinsic silicon layer formed on a substrate;
    a P-type doped region formed in a same plane as the intrinsic silicon layer;
    an oxide semiconductor layer formed adjacent to the intrinsic silicon layer and directly contacting an entire region of the intrinsic silicon layer, the oxide semiconductor functioning as an N-type semiconductor, wherein the intrinsic silicon layer and the P-type doped region form a horizontal structure, and the oxide semiconductor layer and the intrinsic silicon layer form a vertical structure;
    an insulating film formed on an entire surface of the substrate having the intrinsic silicon layer, the P-type doped region, and the oxide semiconductor layer;
    a first contact hole formed in the insulating film and exposing the P-type doped region and a second contact hole formed in the insulating film and exposing a predetermined region of the oxide semiconductor layer;
    a first electrode formed in the first contact hole and on the insulating film so as to be in contact with the P-type doped region; and
    a second electrode formed in the second contact hole and on the insulating film so as to be in contact with the oxide semiconductor layer,
    wherein the P-type doped region and intrinsic silicon layer directly contact the oxide semiconductor.

13. A method of manufacturing a photosensor, the method comprising the steps of:
    forming an intrinsic silicon layer on a substrate;
    forming a P-type doped region in a region of the intrinsic silicon layer; and
    forming an oxide semiconductor layer, which overlaps an entire region of the intrinsic silicon layer and directly contacts the P-type doped region and intrinsic silicon layer,
    wherein the steps of forming the intrinsic silicon layer, the P-type doped region and the oxide semiconductor layer on the substrate comprise:
    sequentially stacking the oxide semiconductor layer and the intrinsic silicon layer on the substrate;
    forming a first photoresist pattern on the intrinsic silicon layer;
    etching the intrinsic silicon layer and the oxide semiconductor layer using the first photoresist pattern as an etch mask; and
    forming the P-type doped region by implanting group 3 impurity ions into a region of the intrinsic silicon layer.

14. The method of claim 13, wherein the step of forming the P-type doped region by implanting the group 3 impurity ions into the region of the intrinsic silicon layer comprises:
    forming a block film on the intrinsic silicon layer to expose a region of the intrinsic silicon layer in which the P-type doped region is to be formed; and
    implanting the group 3 impurity ions into the exposed region of the intrinsic silicon layer.

15. A method of manufacturing a photosensor, the method comprising the steps of:
    forming an intrinsic silicon layer on a substrate;

forming a P-type doped region in a region of the intrinsic silicon layer; and forming an oxide semiconductor layer, which overlaps an entire region of the intrinsic silicon layer, adjacent to the intrinsic silicon layer;

wherein the steps of forming the intrinsic silicon layer, the P-type doped region and the oxide semiconductor layer on the substrate comprise:

forming a first photoresist pattern on the intrinsic silicon layer;

etching the intrinsic silicon layer using the first photoresist pattern as an etch mask;

forming the P-type doped region by implanting group 3 impurity ions into a region of the intrinsic silicon layer;

forming the oxide semiconductor layer on the intrinsic silicon layer;

forming a second photoresist pattern on the oxide semiconductor layer; and etching the oxide semiconductor layer using the second photoresist pattern as an etch mask.

16. The method of claim 13, wherein the step of forming the intrinsic silicon layer on the substrate comprises forming an amorphous silicon layer on the substrate, and crystallizing the amorphous silicon layer into a polycrystalline silicon layer.

17. The method of claim 13, wherein the intrinsic silicon layer and the P-type doped region form a horizontal structure, and the oxide semiconductor layer and the intrinsic silicon layer form a vertical structure.

18. The method of claim 15, wherein the intrinsic silicon layer and the P-type doped region form a horizontal structure, and the oxide semiconductor layer and the intrinsic silicon layer form a vertical structure.

* * * * *